(12) United States Patent
Kabansky

(10) Patent No.: US 6,461,972 B1
(45) Date of Patent: Oct. 8, 2002

(54) INTEGRATED CIRCUIT FABRICATION DUAL PLASMA PROCESS WITH SEPARATE INTRODUCTION OF DIFFERENT GASES INTO GAS FLOW

(75) Inventor: Alex Kabansky, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/747,638

(22) Filed: Dec. 22, 2000

(51) Int. Cl.$^7$ ................................................ H01L 21/302
(52) U.S. Cl. .................. 438/710; 438/711; 438/714; 438/726; 438/730; 438/732
(58) Field of Search .................. 438/706, 710, 438/714, 726, 730, 732, 711

(56) References Cited

U.S. PATENT DOCUMENTS

| | | | | |
|---|---|---|---|---|
| 5,753,886 A | * | 5/1998 | Iwamura et al. | 219/121.43 |
| 5,851,600 A | * | 12/1998 | Horiike et al. | 427/535 |
| 6,235,640 B1 | * | 5/2001 | Ebel et al. | 438/706 |

* cited by examiner

Primary Examiner—Benjamin L. Utech
Assistant Examiner—Binh X. Tran
(74) Attorney, Agent, or Firm—John R. Ley, LLC

(57) ABSTRACT

A dual plasma process generates a microwave neutral plasma remote from a semiconductor wafer and a radio frequency (RF) ionized plasma adjacent to the wafer for simultaneous application to the wafer. A first gas flows through a microwave plasma generation area, without a second gas in the gas flow, to generate the neutral microwave plasma. The second gas is added to the gas flow downstream of the microwave plasma generation area prior to an RF plasma generation area.

13 Claims, 4 Drawing Sheets

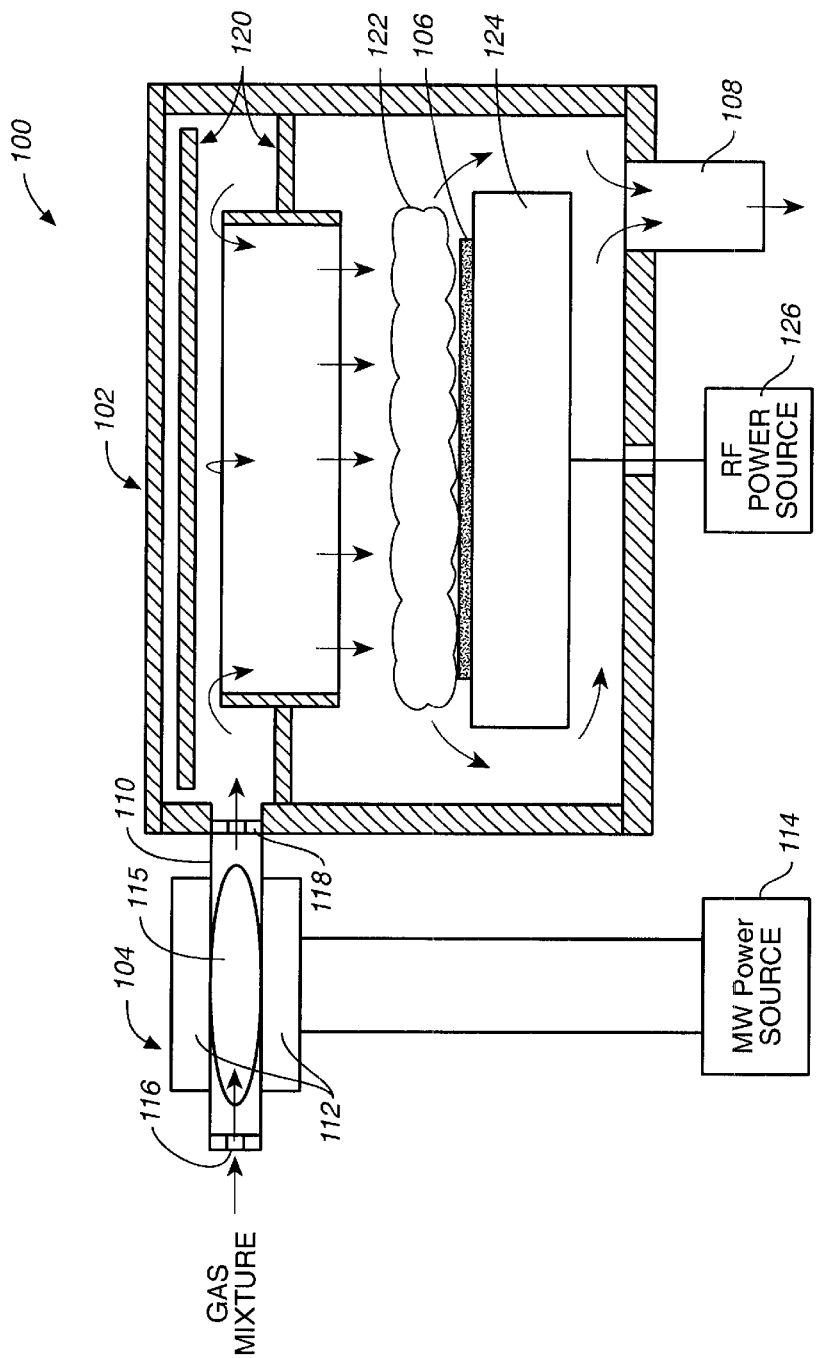
FIG._1 (PRIOR ART)

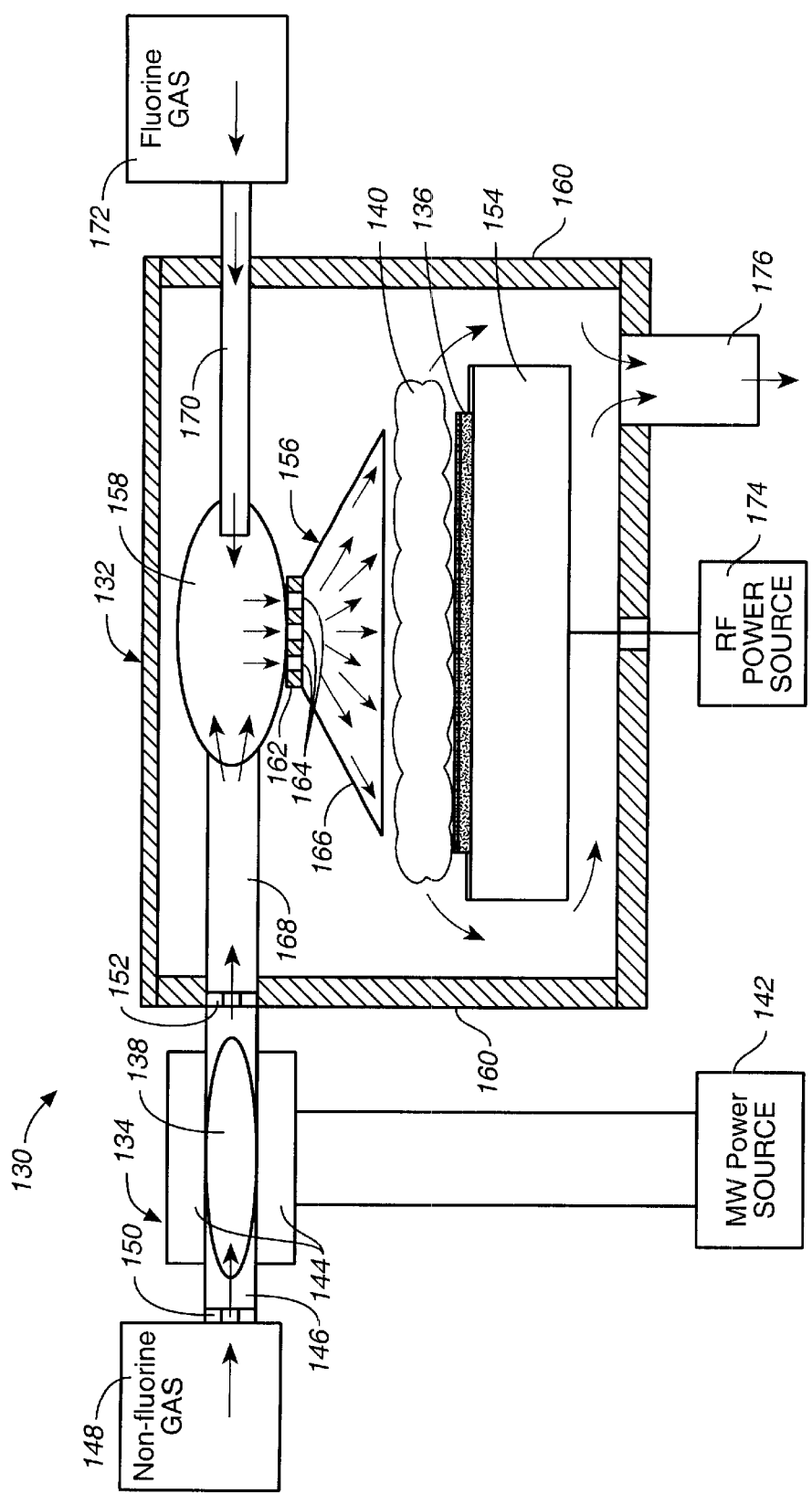
FIG._2

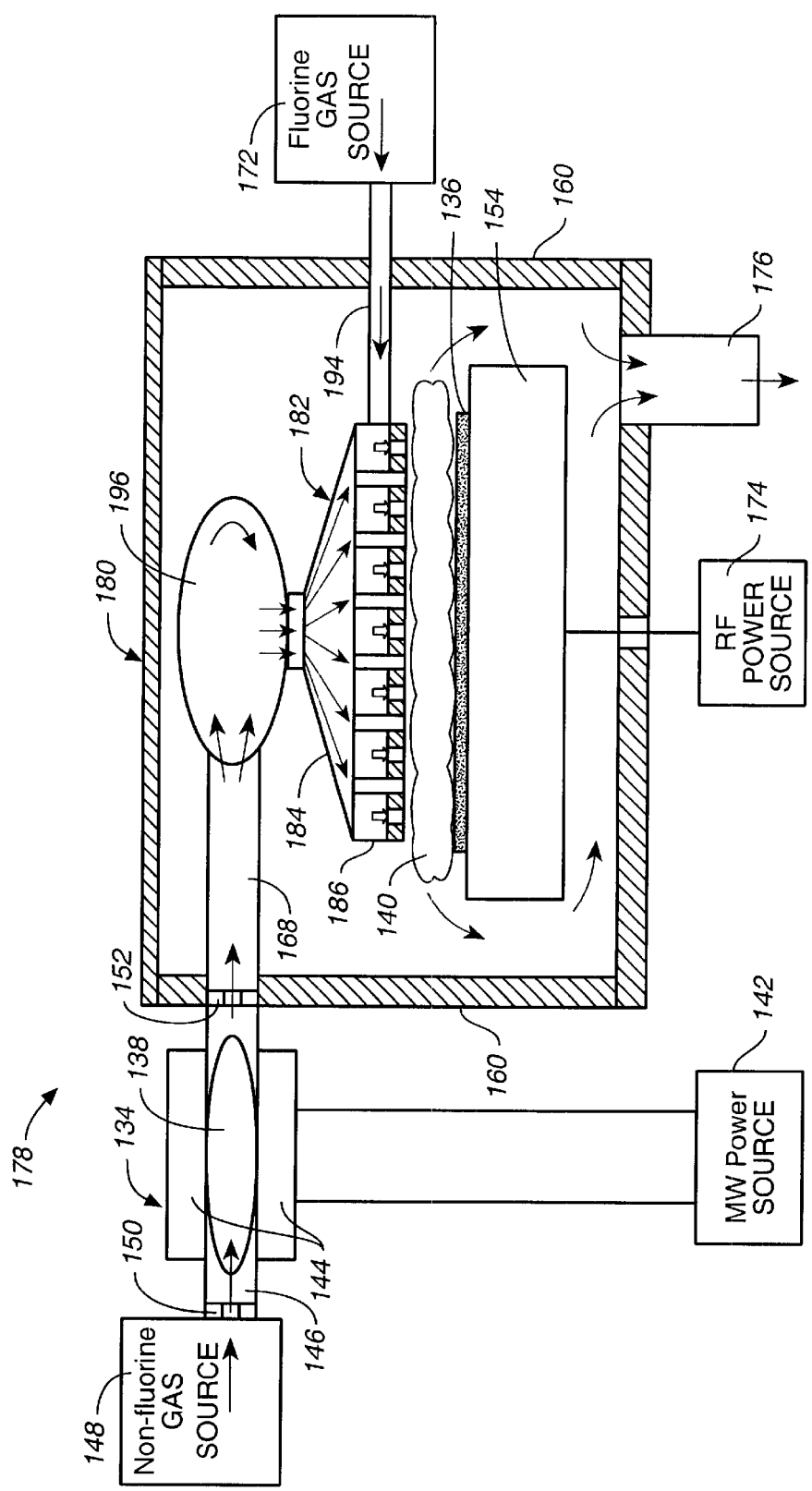
FIG._3

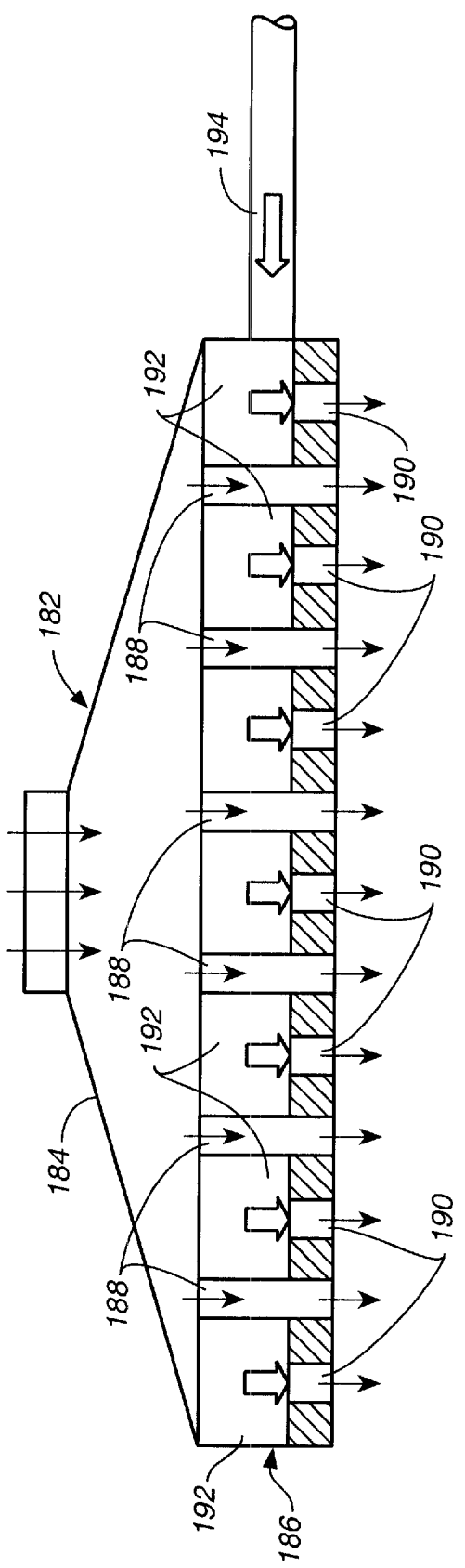
FIG._4

INTEGRATED CIRCUIT FABRICATION DUAL PLASMA PROCESS WITH SEPARATE INTRODUCTION OF DIFFERENT GASES INTO GAS FLOW

FIELD OF THE INVENTION

This invention relates to semiconductor wafer processing in the fabrication of integrated circuits. More particularly, the present invention relates to a new and improved way to combine a microwave generated neutral species plasma with a radio frequency generated ionized species plasma for dual plasma fabrication processes. As a result, the useful lifetime of the hardware is increased, the generation of unwanted particles from the hardware is reduced, the mean time between maintenance is increased, the stability and integrity of the performance of the etch or clean process is increased, and the overall cost of the process is decreased.

BACKGROUND OF THE INVENTION

In the fabrication of integrated circuits (IC's) on semiconductor wafers, "dual" plasma processes have been developed to etch dielectric, polysilicon and metal materials from the wafers. Dual plasma processes have also been used to remove organic materials, including photoresist, BARC (bottom anti-reflection coating) layers, etc., from the wafers. Either plasma can be generated alone and applied to the wafer in a "single plasma mode." The dual plasma mode, however, enables a greater variety of resist and residue cleaning applications than does the single plasma mode.

In the dual plasma mode, two plasmas are applied to a wafer to realize the etch process requirements or parameters. Such process requirements and parameters involve the process rate, the uniformity of the process across the entire wafer, the selectivity of the process to the type of material to be removed and the shape, profile and aspect ratio of the features on the wafer, among other parameters and requirements. One plasma is typically generated by microwave energy, and the other plasma is typically generated by radio frequency (RF) energy.

Typically, one plasma is generated in a region remote from the wafer to avoid damage caused by uncontrolled ion bombardment from the plasma. Typically, the remotely generated plasma is the microwave plasma, or an "inductively coupled plasma" (ICP). The microwave plasma generation area is far enough removed from the wafer that any ions generated in the microwave plasma recombine or are removed, so that only neutral species (e.g. atomic oxygen, atomic hydrogen, etc.) from the microwave plasma reach the wafer. The neutral species are plasma components without an electrical charge. Some of the neutral species are also typically generated in the plasma as a result of decomposition of the original gaseous molecules.

Without ions, the neutral species involve only chemically reactions in the material removal process. The reaction rate depends on the specie type, the material type and the temperature in the process chamber.

For advanced resist and residue removal applications, an additional RF plasma is introduced independently of the microwave plasma near the wafer by applying RF power to the chuck. The RF plasma includes charged reactive ionized species (ions). The ionized species affect the surface of the wafer with high energy (i.e. impact the wafer with a "bombardment" effect) and with a reactivity that can be higher than the reactivity of the neutral species. The ion species improve the efficiency of the process, so that highly modified resist materials and tough residues can be removed by the dual plasma mode.

The dual plasma mode is based on introducing fluorine and non-fluorine process gases into the process chamber through the microwave plasma generation area. The gases that contain fluorine include carbon tetrafluoride (CF4), fluoroform (CHF3), hexafluoroethane (C2F6), nitrogen trifluoride (NF3) and sulfur hexafluoride (SF6), among others. The non-fluorine gases include oxygen, nitrogen, carbon monoxide and water vapor, among others. The gases are mixed together and the gas mixture flows through the remote microwave plasma generation area. The microwave plasma is generated with non-charged reactive neutral species, such as atomic fluorine (F), atomic oxygen (O), atomic nitrogen (N), atomic hydrogen (H), etc. The neutral species can reach the RF plasma generation area near the wafer. In the RF plasma generation area, the RF plasma (including the charged reactive ionized species) is formed in the gas mixture. The combination of both plasmas forms the plasma environment that removes the resist materials and residues that remain on the wafer surface after performing other fabrication processes, such as wafer etch, implantation, etc.

An exemplary prior art assembly 100 for a chamber configuration for a dual plasma process is shown in FIG. 1. The assembly 100 includes a wafer processing chamber 102 connected to a microwave plasma generation assembly 104. The gas mixture (e.g. containing both the fluorine and non-fluorine gases) flows through the microwave plasma generation assembly 104, into the chamber 102, down to a wafer 106 and out of the chamber through a gas outlet 108. The wafer 106 is thus subjected to both of the plasmas inside the chamber 102.

The microwave plasma assembly 104 includes a plasma tube 110 surrounded by a microwave waveguide 112 that is connected to a microwave power source 114. The plasma tube 110 is typically made of quartz, sapphire, ceramic alumina or other dielectric materials. A microwave plasma generation area 115 is inside the plasma tube 110. The gas mixture enters the plasma tube 110 through a gas inlet 116. As the gas mixture flows through the plasma tube 110, the microwave power source 114 supplies microwave power to the microwave guide 112, which generates the microwave plasma in the gas mixture in the plasma tube 110. The gas mixture (e.g. the microwave plasma of neutral species, including the neutral fluorine reactive species) flows from the plasma tube 110 into the chamber 102 through a chamber inlet 118.

The chamber 102 includes a gas distribution module 120, an RF plasma generation area 122 and a wafer chuck 124. The wafer 106 sits on the wafer chuck 124. The wafer chuck 124 is connected to an RF power source 126. The RF power source 126 supplies RF power to the wafer chuck 124, which generates the RF plasma in the RF plasma generation area 122 directly above the wafer 106. As the gas mixture enters the chamber 102, the gas mixture flows around and through the gas distribution module 120, which evenly distributes the gas mixture across the wafer 106 and the RF plasma generation area 122. As the gas mixture approaches the wafer 106, ions (e.g. fluorine ions, oxygen ions, etc.) are generated in the RF plasma in the RF plasma generation area 122. The wafer chuck 124 is RF biased by the RF power from the RF power source 126, so the ions are accelerated toward the wafer 106 to bombard the wafer 106. The ionized and neutral species of the two plasmas, thus, perform the etch, ash or clean process on the wafer 106.

In many cases, the presence of the fluorine gas in the plasma tube 110 can modify or damage the plasma tube 110 and other parts in the assembly 100 that are close to the microwave plasma generation area by eroding the inner wall of the plasma tube 110 or parts of the chamber 102 or decomposing the surface of the inner wall of the plasma tube 110 or the parts of the chamber 102. The damage affects the overall process, reduces the useful lifetime of the hardware, causes unwanted particle generation from the damaged areas, reduces mean time between maintenance and increases the cost of the process, among other things. When the inner wall of the plasma tube 110 or any parts of the chamber 102 are eroded, particles from the inner wall enter the gas mixture flow. Such particles can damage the wafer 106 or alter structures (not shown) formed on the wafer 106. The erosion also reduces the useful lifetime of the hardware, since the eroded hardware has to be replaced. Frequent interruptions in the fabrication of the IC's in order to perform maintenance to replace hardware (i.e. short mean time between maintenance) increases the cost of the fabrication process and reduces the number of IC's that can be fabricated in a given time period.

It is with respect to these and other background considerations that the present invention has evolved.

SUMMARY OF THE INVENTION

The present invention decreases the overall cost of dual plasma etch, ash and clean processes performed on semiconductor wafers, increases the useful lifetime of the hardware used in the processes, reduces the generation of unwanted particles from the hardware, increases the mean time between maintenance and increases the stability and integrity of the performance of the plasma processes. A gas flow of only non-fluorine gas passes through the microwave plasma generation area that is remotely located from the wafer. Fluorine gas is introduced into the gas flow downstream of the microwave plasma generation area, instead of upstream, so the fluorine gas does not pass through the microwave plasma generation area. In this manner, the risk of damage by fluorine to the plasma tube in which the microwave plasma is generated and to surrounding structures is eliminated. Since no erosion occurs to the hardware by the fluorine gas, significantly fewer particles that could damage the wafer or reduce the stability or integrity of the plasma process are introduced into the gas flow, and the useful lifetime of the hardware is greatly increased. Thus, the plasma process can operate longer without having to be shut down as often for maintenance purposes as is necessitated by prior dual plasma processes, so the mean time between maintenance increases. The longer operating time increases the average number of wafers that can be processed in a given time period. The increased number of processed wafers and the decreased frequency of replacing hardware decreases the overall cost per wafer of the plasma process.

These and other improvements are achieved by performing a dual plasma process, such as a plasma etch and/or clean process, on a semiconductor wafer by flowing the first gas through the first plasma generation area to generate the first plasma without the second gas. After the first gas passes through the first plasma generation area, the second gas is added to the gas flow of the first gas. The combined gases, containing the second gas and the plasma of the first gas, are flowed through the second plasma generation area to generate the second plasma from the gas mixture. Both plasmas are then applied simultaneously to the semiconductor wafer.

The first gas is preferably a non-fluorine gas, and the first plasma is preferably generated therefrom with microwave energy. The second gas is preferably a fluorine gas, and the second plasma is preferably generated from the gas mixture with radio frequency energy.

The gas flow preferably passes through a distribution system having several nozzles that evenly distribute the gases to the second plasma generation area next to the wafer. Thus, in one embodiment, the gases are preferably mixed together upstream of the nozzles and pass through the same nozzles together. In another embodiment, the gases are preferably mixed together downstream of the nozzles, in which case, the gases preferably flow through different paths to different sets of the nozzles to be separately distributed to the second plasma generation area and mixed together upon exiting from the nozzles.

The previously mentioned and other improvements are also achieved in an improved dual plasma process assembly in which a semiconductor wafer is subjected to a dual plasma process, such as a plasma etch and/or clean process. The improved dual plasma process assembly includes a gas flow path and a gas mixture area. The gas flow path extends from the first plasma generation area, through the second plasma generation area, to the wafer. The gas mixture area is in the gas flow path between the two plasma generation areas. The first gas (preferably a non-fluorine gas), from which the first plasma is generated (preferably by microwave energy), enters the gas flow path at the first plasma generation area. The second gas (preferably a fluorine gas) enters the gas flow path at the gas mixture area, downstream of the first plasma generation area. Thus, the second gas does not flow through the first plasma generation area. The second plasma is generated (preferably by radio frequency energy) from the gas mixture of the second gas and the first gas containing the first plasma.

The assembly also preferably includes distribution nozzles between the two plasma generation areas for evenly distributing the gases to the second plasma generation are next to the wafer. In a first embodiment, the two gases are preferably mixed upstream of the nozzles and flow together through the same nozzles. In a second embodiment, one portion of the nozzles preferably receives the first gas/plasma and evenly distributes it to the second plasma generation area, and a second portion of the nozzles receives the second gas and evenly distributes it to the second plasma generation area. In this case, the gases are mixed downstream of the nozzles upon exiting from the nozzles.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a cross sectional view of a prior art dual plasma process assembly.

FIG. 2 is a cross sectional view of a dual plasma process assembly incorporating the present invention.

FIG. 3 is a cross sectional view of a dual plasma process assembly incorporating the present invention in an alternative embodiment to the dual plasma process assembly shown in FIG. 2.

FIG. 4 is a cross sectional view of a gas distribution assembly utilized in the dual plasma process assembly shown in FIG. 3.

DETAILED DESCRIPTION

A dual plasma process assembly 130 generally includes a process chamber 132 and a microwave plasma assembly 134, as shown in FIG. 2. In the fabrication of integrated circuits (ICs) (not shown) on semiconductor wafers (e.g. wafer 136) such dual plasma processes commonly include etch, ash and clean processes that remove material, residue or debris from the surface of the wafer 136. The dual plasma mode, or process, typically generates two plasmas, which are applied to the wafer 136 simultaneously, to perform the dual plasma process on the wafer 136. The two plasmas typically include a microwave neutral (not electrically charged) reactive species plasma generated in a microwave plasma generation area 138 in the microwave plasma assembly 134 remote from the wafer 136 and a radio frequency (RF) reactive ionized (electrically charged) species plasma generated in an RF plasma generation area 140 in the process chamber 132 next to the wafer 136.

The microwave plasma is typically generated from a gas that does not contain fluorine (or chlorine). The RF plasma, on the other hand, is typically generated from a mixture of the non-fluorine gas (after the microwave plasma has been generated therein) and a gas that contains fluorine (or chlorine). The non-fluorine gas flows, without the fluorine gas, through the microwave plasma generation area 138, so that the microwave plasma can be generated from the non-fluorine gas. The fluorine gas is then added to the flow of the non-fluorine gas (containing the non-fluorine microwave plasma) downstream of the microwave plasma generation area 138, instead of upstream. In this manner, any potential damage that might be caused by the presence of the fluorine gas in the microwave plasma generation area 138 is eliminated.

The microwave plasma assembly 134 typically includes a conventional microwave power source 142, a conventional microwave guide 144 and a conventional plasma tube 146. The plasma tube 146 is typically made of quartz, sapphire, ceramic alumina or other dielectric materials. A conventional source 148 for the non-fluorine gas is connected to an inlet 150 of the plasma tube 146 to deliver the non-fluorine gas into the plasma tube 146. The microwave plasma generation area 138 is inside the plasma tube 146. The microwave power source 142 is connected to the microwave guide 144 to deliver microwave power thereto. The plasma tube 146 is surrounded by the microwave guide 144, so that microwave energy generated by the microwave power in the microwave guide 144 is delivered to the non-fluorine gas flowing through the microwave plasma generation area 138. The microwave plasma is, thus, generated from the microwave energy and the non-fluorine gas.

The plasma tube 146 connects to the process chamber 132, so that the microwave plasma can flow through an outlet 152 in the plasma tube 146 into the process chamber 132. The microwave plasma assembly 134 is typically external to the process chamber 132, so that the microwave plasma generation area 138 is sufficiently remote from the wafer 136 that any ions generated by the microwave plasma assembly 134 in the microwave plasma do not reach the wafer 136 to cause ion bombardment on the wafer 136. Therefore, only neutral (i.e. not electrically charged) components, or species, of the microwave plasma reach the wafer 136.

The process chamber 132 generally includes a conventional conductive wafer chuck 154, a conventional gas distribution assembly 156 and a gas mixing chamber 158. The wafer 136, upon which the dual plasma process is to be performed, is placed on the wafer chuck 154 inside the process chamber 132 through an access door (not shown) in a sidewall 160 of the process chamber 132 by a robot arm (not shown). The RF plasma generation area 140 is adjacent to and directly above the wafer 136. The gas distribution assembly 156 includes a gas distribution "shower head-like" device 162 with a set of distribution nozzles 164 and a distribution cone 166 above the RF plasma generation area 140. The shower head 162 connects to the gas mixing chamber 158, so that the distribution nozzles 164 are open to the gas mixing chamber 158. The gas mixing chamber 158 connects through a gas duct 168 to the outlet 152 of the plasma tube 146 and through another gas duct 170 to a source 172 of the fluorine gas external to the process chamber 132.

The non-fluorine gas containing the microwave plasma flows through the gas duct 168 into the gas mixing chamber 158. The fluorine gas flows from the fluorine gas source 172 through the gas duct 170 into the gas mixing chamber 158. The fluorine gas and the non-fluorine gas mix together in the mixing chamber 158 to create a gas mixture. The gas mixture flows through the distribution nozzles 164 in the shower head 162 and is evenly distributed by the distribution cone 166 to the RF plasma generation area 140 next to the wafer 136.

The wafer chuck 154 is electrically connected to an RF power source 174 (typically external to the process chamber 132). The RF power source 174 delivers RF power to the wafer chuck 154 to RF bias the wafer chuck 154, which thereby delivers RF energy to the RF plasma generation area 140. The RF energy generates the RF plasma in the gas mixture containing the fluorine gas in the RF plasma generation area 140. The RF plasma is a reactive ion plasma (i.e. contains electrically charged species). The RF power causes an RF bias of the wafer chuck 154, which accelerates the fluorine and other ions in the RF plasma toward the wafer 136 to cause ion bombardment on the wafer 136. At the same time, the neutral species in the accompanying microwave plasma also contact the wafer 136. The reactive ionized species and the reactive neutral species remove unwanted materials (e.g. films, residue, debris, etc.) from the surface of the wafer 136. The gas mixture, along with removed material from the wafer 136, flows around the wafer chuck 154 and out a gas exhaust vent 176 from the process chamber 132.

An alternative dual plasma process assembly 178, as shown in FIG. 3, includes the microwave plasma assembly 134 and a process chamber 180. The microwave plasma assembly 134 is similar to the same assembly 134 shown in FIG. 2. The process chamber 180, on the other hand, includes certain differences from the process chamber 132 shown in FIG. 2. In particular, the process chamber 180 includes a gas distribution assembly 182 that receives the fluorine and non-fluorine gases through different gas flow paths, so that the fluorine and non-fluorine gases do not mix until exiting from the gas distribution assembly 182 into the RF plasma generation area 140.

The gas distribution assembly 182 includes a distribution cone 184 and a shower head 186. The shower head 186 is shown in greater detail in FIG. 4 and includes two sets of nozzles 188 and 190. The tops of the nozzles 188 open to the interior of the distribution cone 184. The tops of the nozzles 190, however, open to a channel 192 within the shower head 186 that connects to a gas duct 194. The bottoms of all of the nozzles 188 and 190 open to the RF plasma generation area 140 (FIG. 3). The nozzles 188 and 190 are evenly spaced, so that the non-fluorine gas (containing the microwave plasma) and the fluorine gas are evenly distributed to the RF plasma generation area 140. Upon exiting from the nozzles 188 and 190 into the RF plasma generation area 140, the two gases mix together.

Referring back to FIG. 3, the gas duct 194 connects to the fluorine gas source 172. Thus, the fluorine gas flows into the shower head 186 from the gas duct 194 and through the channel 192 (FIG. 4) and the nozzles 190 (FIG. 4) into the RF plasma generation area 140.

The top of the distribution cone 184 connects to a pre-distribution chamber 196. The pre-distribution chamber 196 in turn connects to the gas duct 168, which connects to the microwave plasma assembly 134 at the outlet 152.

The non-fluorine gas enters the dual plasma process assembly 178 at the inlet 150 to the plasma tube 146. Powered by the microwave power source 142, the microwave guide 144 generates the microwave plasma in the non-fluorine gas in the microwave plasma generation area 138 in the plasma tube 146. The non-fluorine gas (containing the microwave plasma) flows out of the plasma tube 146 through the outlet 152 into the gas duct 168 in the process chamber 180. The non-fluorine gas flows through the gas duct 168 into the pre-distribution chamber 196 and to the distribution cone 184. The non-fluorine gas then flows through the nozzles 188 (FIG. 4) in the shower head 186 and into the RF plasma generation area 140.

Upon entering the RF plasma generation area 140, the RF biased wafer chuck 154 generates the RF plasma in the gas mixture containing fluorine gas. The fluorine and other ions in the RF plasma then bombard the surface of the wafer 136. The neutral species of the microwave plasma in the non-fluorine gas flow also contact the surface of the wafer 136. Together, the RF plasma and the microwave plasma perform the dual plasma process on the wafer 136.

In both embodiments (FIGS. 2 and 3), the microwave plasma is introduced into the process chamber 132 or 180 from the side. However, the microwave plasma may also be introduced into the process chamber 132 or 180 from the top, which results in different process parameters.

In either the embodiment shown in FIG. 2 or the alternative embodiment shown in FIG. 3, the fluorine gas is added to the flow of the non-fluorine gas downstream of the microwave plasma generation area 138. Thus, the present invention has the advantage of eliminating any damage by the fluorine gas or fluorine plasma to the plasma tube 146 and any surrounding structure, such as the gas duct 168. In this manner, the useful life of the hardware (in particular the plasma tube 146) and the time between maintenance periods are greatly extended. Also, the stability and integrity of the dual plasma process in increased, since fewer foreign particles are introduced into the gas flow by erosion of the hardware. Thereby, the over all cost of the dual plasma process is decreased.

In the case of the embodiment shown in FIG. 3, the shower head 186 is more complex and expensive than the shower head 162 (FIG. 2). The introduction of the fluorine gas into the gas flow even further downstream from the microwave plasma generation area 138 than in the embodiment shown in FIG. 2, however, may justify the added expense, depending on the specific situation in which the dual plasma process assembly 130 (FIG. 2) or 178 (FIG. 3) is used.

Additionally, due to the less damaging nature of the non-fluorine gas in the plasma tube 146, a plasma tube 146 made of quartz is preferably used, instead of the more expensive, but more durable, sapphire plasma tube, without sacrificing the performance of the overall dual plasma process. Thus, the equipment cost is reduced.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

The Invention claimed is:

1. A method of performing a dual plasma process on a semiconductor wafer using gases from which first and second plasmas are generated in first and second plasma generation areas, respectively, comprising the steps of:

flowing a first gas through the first plasma generation area;

generating the first plasma from the first gas in the first plasma generation area;

flowing the first plasma out of the first plasma generation area;

flowing a second gas into the flowing first plasma after the first plasma flows out of the first plasma generation area;

forming a gas mixture of the first plasma and the second gas by mixing the second gas with the first plasma;

flowing the gas mixture through the second plasma generation area;

generating the second plasma from the gas mixture in the second plasma generation area; and applying the first and second plasmas to the semiconductor wafer simultaneously.

2. A method as defined in claim 1 comprising the further step of:

performing an etch and clean process on the semiconductor wafer using the first and second plasmas.

3. A method as defined in claim 1 comprising the further steps of:

disposing a plurality of distribution nozzles between the first and second plasma generation areas to evenly distribute the first plasma and the second gas to the second plasma generation area; and mixing the second gas into the first plasma upstream of the distribution nozzles and downstream of the first plasma generation area.

4. A method as defined in claim 1 comprising the further steps of:

disposing a plurality of distribution nozzles between the first and second plasma generation areas; and mixing the second gas into the first plasma downstream of the distribution nozzles.

5. A method as defined in claim 4 comprising the further steps of:

connecting a first portion of the distribution nozzles to the first plasma generation area;

connecting a second portion of the distribution nozzles to a source for the second gas;

flowing the first plasma through the first portion of the distribution nozzles;

flowing the second gas through the second portion of the distribution nozzles; and mixing the second gas and the first plasma upon exiting from the distribution nozzles.

6. A method as defined in claim 1 comprising the further step of:

flowing a non-fluorine gas through the first plasma generation area to generate the first plasma from the non-fluorine gas prior to flowing the second gas into the flowing first plasma.

7. A method as defined in claim 6 comprising the further step of:
   selecting the non-fluorine gas from. the group consisting of oxygen, nitrogen, argon, carbon monoxide and water.

8. A method as defined in claim 1 comprising the further step of:
   flowing a fluorine gas into the flowing first plasma after flowing the first gas through the first plasma generation area.

9. A method as defined in claim 8 comprising the further step of:
   selecting the fluorine gas from the group consisting of carbon tetrafluoride, fluoroform, hexafluoroethane, nitrogen trifluoride and sulfur hexafluoride.

10. A method as defined in claim 1 comprising the further steps of:
    applying microwave energy to the first gas in the first plasma generation area prior to generating the first plasma; and
    generating the first plasma from the first gas and the microwave energy in the first plasma generation area.

11. A method as defined in claim 10 comprising the further step of:
    flowing the second gas into the flowing first plasma and forming the gas mixture remote from the microwave energy.

12. A method as defined in claim 11 comprising the further steps of:
    applying radio frequency energy to the gas mixture in the second plasma generation area prior to generating the second plasma; and
    generating the second plasma from the gas mixture and the radio frequency energy in the second plasma generation area.

13. A method of applying a first plasma and a second plasma to a semiconductor wafer during processing using first and second gases, comprising the steps of:
    generating the first plasma from the first gas in a first plasma generation area;
    combining into a gas mixture the second gas and the first gas containing the first plasma;
    generating the second plasma from the gas mixture in a second separate plasma generation area; and
    simultaneously applying the first and second plasmas to the semiconductor wafer.

* * * * *